(12) United States Patent
Shim et al.

(10) Patent No.: US 11,591,237 B2
(45) Date of Patent: Feb. 28, 2023

(54) LAYERED COMPOUND AND NANOSHEET CONTAINING INDIUM AND PHOSPHORUS, AND ELECTRICAL DEVICE USING THE SAME

(71) Applicant: Industry-Academic Cooperation Foundation, Yonsei University, Seoul (KR)

(72) Inventors: Woo-young Shim, Seoul (KR); Min-jung Kim, Gwangju (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 204 days.

(21) Appl. No.: 17/111,042

(22) Filed: Dec. 3, 2020

(65) Prior Publication Data
US 2022/0073363 A1 Mar. 10, 2022

(30) Foreign Application Priority Data
Sep. 9, 2020 (KR) .................. 10-2020-0115374

(51) Int. Cl.
C01G 15/00 (2006.01)
H01L 29/06 (2006.01)
B82Y 30/00 (2011.01)
B82Y 40/00 (2011.01)

(52) U.S. Cl.
CPC ........ *C01G 15/006* (2013.01); *H01L 29/0665* (2013.01); *B82Y 30/00* (2013.01); *B82Y 40/00* (2013.01); *C01P 2002/72* (2013.01); *C01P 2004/24* (2013.01); *C01P 2004/64* (2013.01); *C01P 2006/40* (2013.01); *C01P 2006/42* (2013.01)

(58) Field of Classification Search
None
See application file for complete search history.

(56) References Cited

U.S. PATENT DOCUMENTS

2019/0157386 A1* 5/2019 Ando .................. H01L 29/775

FOREIGN PATENT DOCUMENTS

| CN | 102208756 A | 10/2011 |
|---|---|---|
| EP | 0271080 A2 | 6/1988 |
| KR | 20140049190 A | 4/2014 |
| KR | 20190132152 A | 11/2019 |
| KR | 20190132294 A | 11/2019 |
| KR | 10-2057700 B1 | 12/2019 |

OTHER PUBLICATIONS

Kirfel, A. Petcov et al.,"Physical, and Chemical Aspects of Crystalline Materials", International Journal, vol. 195, No. 1/2, 1991.
Jochen Gerwann, "European Search Report for EP Application No. 20211721.4", dated Apr. 26, 2021, EPO, Germany.

* cited by examiner

*Primary Examiner* — Jeffrey D Washville
(74) *Attorney, Agent, or Firm* — Bridgeway IP Law Group, PLLC; Jihun Kim

(57) ABSTRACT

Proposed are a layered compound having indium and phosphide, a nanosheet that may be prepared using the same, and an electrical device including the materials. Proposed is a layered compound represented by $K_{1-x}In_yP_z$ ($0 \leq x \leq 1.0$, $0.75 \leq y \leq 1.25$, $1.25 \leq z \leq 1.75$).

16 Claims, 12 Drawing Sheets

LAYERED COMPOUND AND NANOSHEET CONTAINING INDIUM AND PHOSPHORUS, AND ELECTRICAL DEVICE USING THE SAME

BACKGROUND OF THE INVENTION

1. Field of the Invention

The present invention relates to a layered compound and a nanosheet containing indium and phosphorus, and an electrical device using the same, and more particularly, to a layered compound and a nanosheet containing an alkali metal and containing indium and phosphorus having various electrical properties, and an electrical device using the same.

2. Description of the Related Art

Layered compounds connected to interlayers through van der Waals bonds may show various properties, and the layered compounds may be delaminated through physical or chemical methods to prepare two-dimensional (2D) nanosheets having a thickness of several to hundreds of nanometers, and thus, active research into the layered compounds is underway.

In particular, low-dimensional materials such as nanosheets are expected to have innovative new functions that existing bulk materials fail to provide, and are highly likely to serve as next-generation future materials instead of the existing materials.

However, up until now, the layered compounds having a two-dimensional crystal structure are limited to materials such as graphite, transition metals, and chalcogen compounds to hardly develop into materials of various compositions.

Meanwhile, indium phosphide is widely used in high-power, high-frequency electrical devices as a compound semiconductor material but up until now, indium phosphide having a layered structure is not specifically known.

Indium phosphide compounds having a layered structure, unlike existing indium phosphide compounds having a different crystal structure, are expected to allow diversified application, and to be applicable to new areas that have not been reached before.

RELATED ART DOCUMENT

Patent Document

Korean Registered Patent Publication No. 10-2057700
Korean Patent Laid-open Publication No. 2019-0132294
Korean Patent Laid-open Publication No. 2019-0132152

SUMMARY OF THE INVENTION

According to an embodiment of the invention, there are provided a layered compound having indium and phosphide, a nanosheet that may be prepared using the same, and an electrical device including the materials.

According to a first aspect of the invention, there is provided a layered compound represented by $K_{1-x}In_yP_z$ ($0 \leq x \leq 1.0$, $0.75 \leq y \leq 1.25$, $1.25 \leq z \leq 1.75$).

According to a second aspect of the invention, there is provided a nanosheet including a compound represented by $K_{1-x}In_yP_z$ ($0 \leq x \leq 1.0$, $0.75 \leq y \leq 1.25$, $1.25 \leq z \leq 1.75$), and prepared through a physical or chemical peeling method.

According to a third aspect of the invention, there is provided an electrical device including the layered compound of the first aspect or the nanosheet of the second aspect.

A layered compound and a nanosheet provided through an embodiment of the invention may have various electrical properties, thereby enabling the development of new electrical devices.

DETAILED DESCRIPTION OF THE EXEMPLARY EMBODIMENTS

Figure 1:
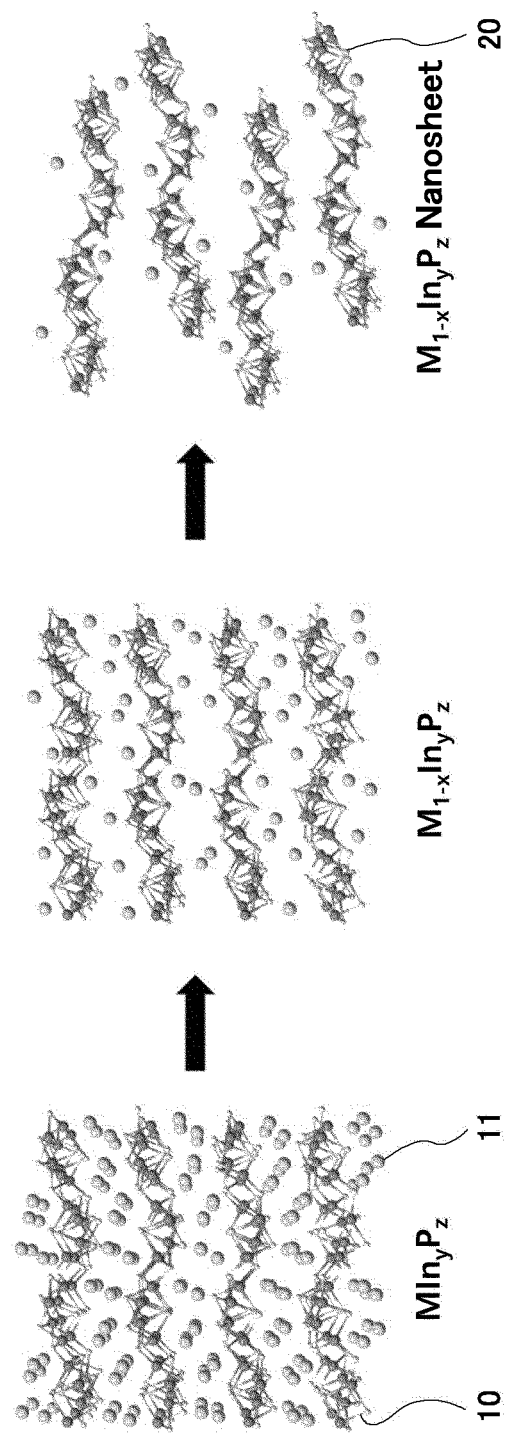
FIG. 1 is a conceptual view illustrating a layered compound according to an embodiment of the invention and a nanosheet prepared using the same.

Hereinafter, configuration and operation of embodiments of the invention will be described with reference to the accompanying drawings. In the following description, when it is determined that the specific description of the known related art unnecessarily obscures the gist of the invention, the detailed description thereof will be omitted. In addition, when an element "includes" a component, it may indicate that the element does not exclude another component unless explicitly described to the contrary, but can further include another component.

A layered InP compound according an embodiment of the invention may be a layered compound represented by Formula 1 below.

$$K_{1-x}In_yP_z \qquad \text{[Formula 1]}$$

($0 \leq x \leq 1.0$, $0.75 \leq y \leq 1.25$, $1.25 \leq z \leq 1.75$)

In general, InP has a zinc blende crystal structure, which is incapable of having a layered structure, and accordingly, using InP to form a nanosheet was hardly achievable.

In order to overcome the limitation, inventors of the invention have come up with an idea of adding additive elements to $In_yP_z$ to place the additive elements between $In_yP_z$ layers so as to prepare a layered compound in which the $In_yP_z$ layers are connected. To this end, the inventors have calculated to create a layered material having a new composition and a crystal structure, and as a result, they have succeeded to synthesize a previously unreported new composition of a layered $K_2In_2P_3$ to prepare a layered compound having a composition of Formula 1 above.

In the layered compound having the composition of Formula 1, K is positioned between the $In_yP_z$ layers to weakly bond the $In_yAs_z$ layers through van der Waals bonds, and a plane on which K is positioned forms a cleavage plane that is easily cleaved along the plane.

Meanwhile, in the composition of K in the $K_{1-x}In_yP_z$ layered compound or nanosheet, x may be 0 according to Formula 1 described above, and as described above, $K_2In_2P_3$ is a previously unreported new synthesized material where x is 0 in Formula 1. In addition, as x is 0, even without the removal of K, the plane containing K may be peeled off as a cleavage plane that forms weak van der Waals bonds.

In the layered compound according to an embodiment of the invention, as described above, K is positioned between the $In_yP_z$ layers to weakly bond the $In_yP_z$ layers through the van der Waals bonds, and along this cleavage plane, the plane may thus be easily peeled off into the $In_yP_z$ layers through either or both physical or chemical methods, and the more K, an additive element, is removed, the weaker the interlayer bonding force is, and the easier the peeling is. Accordingly, through the physical or chemical peeling method, an $In_yP_z$ nanosheet may be easily obtained from the layered compound, and in this case, K may partially remain in the $In_yP_z$ nanosheet.

With the continuous removal of the additive element K, the distance between the $In_yP_z$ compound layers gradually becomes greater, and eventually the bond between the layer breaks down, which may cause cracks between the layers. Therefore, the layered structure of the layered compound described in an embodiment of the invention includes a case where a repeating two-dimensional $In_yP_z$ layers are interlayer-bonded through van der Waals bonds, as well as a case where the bonding force between the $In_yP_z$ layers is removed to increase the interlayer distance, thereby causing cracks.

A conceptual view of examples of the layered compound and the nanosheet is shown in FIG. 1, which shows that an additive element, K 11, is positioned between $In_yP_z$ layers 10 of $KIn_yP_z$ to keep the bond between the $In_yP_z$ layers 10, and in this case, the removal of K 11 weakens the bond between the $In_yP_z$ layers 10, and thus to be easily peeled off physically or chemically, thereby in the end, developing into an $In_yP_z$ nanosheet 20. In this case, the additive element may partially remain in the $In_yP_z$ nanosheet.

The nanosheet prepared through the peeling from the layered compound may be a single layer of $In_yP_z$, but may be formed when a plurality of layers overlaps to be several hundreds of nm thick. In general, nanosheets may exhibit anisotropy according to a two-dimensional shape only when a thickness to a lateral width is less than a certain level. To this end, the ratio of a thickness (d) to a width (L) of a nanosheet (d/L) is preferably 0.1 or less. A width of the nanosheet prepared through an embodiment of the invention may be 5 μm or greater, and thus, a thickness of the nanosheet is preferably 500 nm or less. In this case, the additive element may partially remain in the $In_yP_z$ nanosheet.

As such, the nanosheet according to an embodiment of the invention refers to a sheet that is peeled off from a layered compound through a physical or chemical method, and includes being formed as a plurality of $In_yP_z$ layers in addition to being formed as a single $In_yP_z$ layer.

Residual additive elements may satisfy $0 \le x \le 1$, preferably $0.1 \le m < 0.9$, and more preferably $0.25 \le m \le 0.75$, according to Formula 1 described above. Like $K_2In_2P_3$, as K is all at the right place, x may be 0, and in preparing an $In_yP_z$ compound having a layered structure, some of K to form a layered structure may be removed or may be completely removed.

In addition, x may satisfy $0.1 \le x < 0.9$ to ensure easy peeling and to prevent the breakdown of the layered structure or changes in the crystal structure due to excessive removal of K. In this case, the crystal structure of the layered compound may have a space group of $P2_1/c$. The nanosheet peeled off from the layered compound having the above range of x may equally satisfy $0.1 \le x < 0.9$.

In addition, x for this may have a range of $0.25 \le x \le 0.75$. In the layered compound, in which the additional element, K is partially removed and a certain amount of K remains, K, which is an additional element remaining between the layers, becomes movable to exhibit various electrical properties. Therefore, it may be desirable to remove some of the additive elements from the $KIn_yP_z$ compound and keep the rest some. x for this may have a range of $0.25 \le x \le 0.75$.

Residual additive elements may be in the range of 0.9× according to Formula 1 described above.

When the additive element K is removed, the crystal structure of the layered compound may change, and with the removal of the additive element, the crystal structure of the layered compound may change to a zinc blende structure or amorphous structure. When x is greater than 0.9, the $In_yP_z$ layers may change to a zinc blende structure or an amorphous structure, and even in this case, the plane having some residual additional elements still becomes a cleavage plane in which physical peeling is easily carried out or the bonding force between the $In_yP_z$ layers is removed to increase the interlayer distance, thereby causing cracks, and accordingly, the $In_yP_z$ layers keep a two-dimensional layer to allow the compound to have a layered structure.

In addition, the $K_{1-x}In_yP_z$ nanosheet peeled off from the compound of the composition may also have a zinc blende structure or an amorphous structure.

In Formula 1, y may have a range of $0.75 \le y \le 1.25$ and z may have a range of $1.25 \le z \le 1.75$, and y and z may have slight changes due to defects in an initially prepared $K_2In_2As_3$, and the removal of K may cause slight changes in the ratio of In to P during the removal process, and thus, values of y and z in $K_{1-x}In_yP_z$ may change within a range that does not alter the crystal structure for a given amount of K.

A strong acid such as nitric acid or hydrochloric acid may be used for the removal of additive elements, and as the additive elements are removed through the strong acid, the place where the additive elements are removed is replaced with hydrogen ions included in the strong acid which is then bonded thereto, and thus a layered compound containing hydrogen and a nanosheet prepared using the compound may be provided.

The layered compound containing hydrogen and the nanosheet therefrom may be represented by Formula 2 below.

$$K_{1-x}H_aIn_yP_z \qquad \text{[Formula 2]}$$

(M is at least one of Group I elements, and $0 \le x \le 1.0$, $0 < a \le x$, $0.75 \le y \le 1.25$, $1.25 \le z \le 1.75$).

In this case, hydrogen ions replace the additive elements, and are added in less than the amount of additive elements removed.

X, an amount by which the additive elements are removed, may remain in a very small amount in the range of $0.9 \leq x$. As described above, the crystal structure may change as x becomes 0.9 or greater.

In addition, the range of x may be $0.1 \leq x \leq 0.9$, and more preferably may be $0.25 \leq x \leq 0.75$. As described above, the crystal structure of the initial layered compound, $KIn_yP_z$, is kept as it is, and as the additive element, K, is partially removed, the interlayer bonding force is weakened to easily peel off the compound into the $In_yP_z$ layers, thereby exhibiting various electrical properties through the residual additive elements.

In addition, a above may have the same value as x, and hydrogen ions may replace the removed additive elements to be included in the layered compound.

The layered compound or nanosheet described above exhibit various properties as a result of analysis, and these properties will be described below. The layered compound and the nanosheet described here include both cases of with/without additional elements.

In XRD measurement using CuKα rays, the layered compound or nanosheet according to an embodiment of the invention may have a crystal structure having peaks at the positions of $2\theta=11.51\pm0.50°$, $13.11\pm0.50°$, $25.54\pm0.50°$, $28.09\pm0.50°$, $29.49\pm0.50°$, and $30.81\pm0.50°$. In the present specification, in XRD measurement, the peaks may have an intensity of 3% or greater with respect to a peak having the greatest intensity in the graph provided through the XRD measurement.

In addition, the results of the XRD measurement show that the layered compound or the nanosheet may have a space group of $P2_1/c$.

Meanwhile, with the removal of the additive elements from the layered compound, the crystal structure may change as described above.

The crystal structure of $KIn_yP_z$ before initial additive elements are removed may change to a zinc blende structure or an amorphous structure of general InP layers when the additive element K is removed. Even in this case, the cleavage plane already formed in $KIn_yP_z$ may be kept as it is, or have gradually decreasing bonding force to cause cracks, resulting in having an open structure without forming interlayer bonds, and accordingly, the layered structure may be kept.

Accordingly, in the $In_yP_z$ layer, a layered compound having a zinc blende crystal structure or an amorphous structure, and including a cleavage plane or cracks may be prepared, and the compound is peeled off to prepare an $In_yP_z$ nanosheet having a zinc blende structure or an amorphous structure The layered compound or nanosheet as described above may exhibit various electrical properties due to a unique layered structure and residual additional elements.

First, the layered compound or the nanosheet according to an embodiment of the invention exhibits ferroelectric-like properties.

Ferroelectric properties are generally found in oxides of an asymmetric structure such as $BaTiO_3$ of a perovskite structure, and are found according to changes in the position of Ba located at the cent.

However, the layered compound or nanosheet according to an embodiment of the invention does not have the asymmetric structure, but nevertheless exhibits ferroelectric properties. Despite the fact that the layered compound or nanosheet does not have the asymmetric structure, the layered compound or nanosheet still exhibits ferroelectric-like properties since the position of the residual additive elements moves according to an external electric field.

The ferroelectric-like properties of the layered compound and the nanosheet according to an embodiment of the invention enable application to various electrical devices.

In addition, the layered compound and the nanosheet according to an embodiment of the invention exhibit resistance switching properties.

When a material has resistance switching properties, current does not increase linearly according to voltages applied to the material, but when an initial voltage is applied, the material keeps a high resistance state to have an insignificant increase in the current and then when the material reaches a certain critical point, the material switches to a low resistance state to have a sharp increase in the current.

These resistance switching properties are generally found in oxides, and recently, using these properties, memory devices such as a memristor capable of storing information like a flash memory have been actively developed, and, through the resistance switching properties, the layered compound and the nanosheet of an embodiment of the invention may be actively used in the development of memory devices such as the memristor.

Example

1) Synthesis of $K_2In_2P_3$ Having a Layered Structure

K, In, and P were weighed at a molar ratio of 2:2:3, mixed, and then put into an alumina crucible. Next, the mixture was placed in a quartz tube which was then double-sealed to block outside air. The process was performed in a glove box under argon atmosphere. Thereafter, in the box furnace, the temperature was raised to 750° C. to allow all K, In, and P to be present as a liquid, which were kept for 20 hours, cooled to 500° C. for 100 hours, and kept again for 100 hours to obtain a sample of $K_2In_2P_3$.

2) Removal of K

The layered $K_2In_2P_3$ was subjected to reaction over time in a 1.5M hydrochloric acid solution diluted with IPA to remove K therefrom. The results are shown in the table below.

TABLE 1

| Name of sample | Removal of additive elements | Reaction time | Residual K (at %) |
|---|---|---|---|
| Sample A | — | — | 28.8 |
| Sample B | Hydrochloric acid | 1 hour | 17.2 |
| Sample C | Hydrochloric acid | 6 hours | 1.8 |
| Sample D | Hydrochloric acid | 8 hours | 1.9 |

3) Process of Preparing Nanosheets

The samples prepared as in Table 1 above were irradiated with ultrasonic waves in ethanol to prepare nanosheets peeled off therefrom using a tape.

Results of analyzing the layered compound and the nanosheet obtained through the examples described above will be described in detail below.

Figure 2:
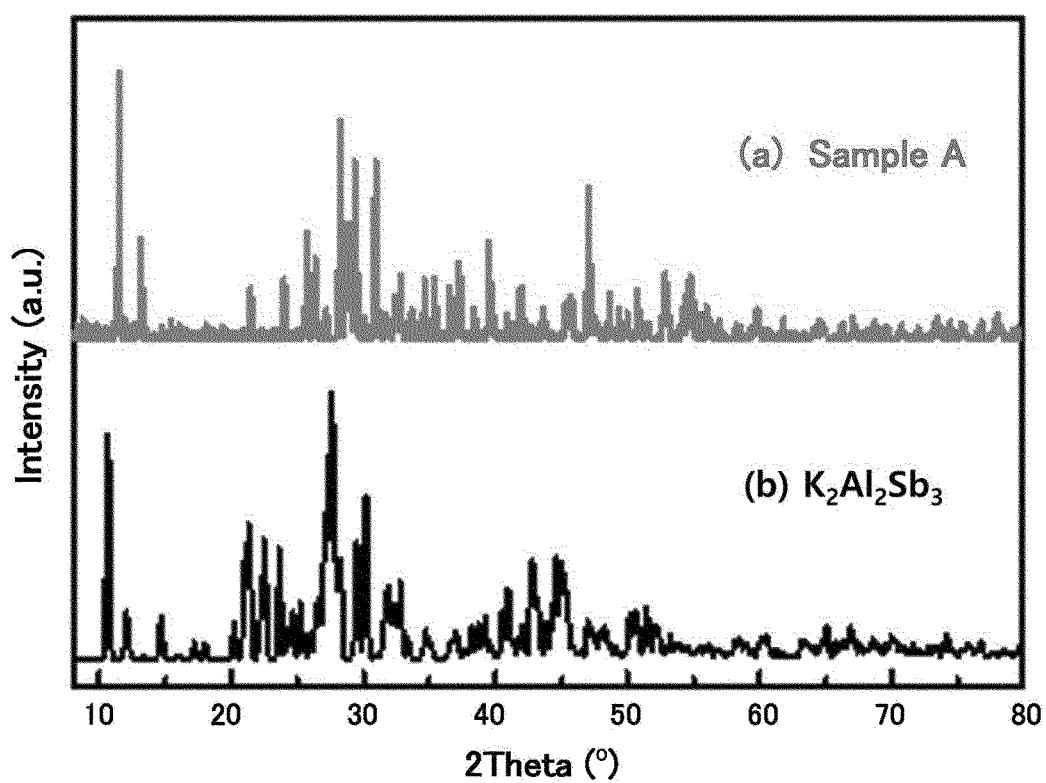
FIG. 2 is a graph illustrating results of XRD analysis of samples according to an embodiment of the invention.

$K_2In_2P_3$ having a layered structure projected through calculation was subjected to synthesis, and as a result, results of XRD measurement on the synthesized layered $K_2In_2P_3$ (Sample A) are shown in FIG. 2. (a) shows peaks from the results of the XRD measurement for Sample A. (B) below shows peaks of $K_2Al_2Sb_3$ projected to have a similar structure. Given that $K_2Al_2Sb_3$ is a material having a space group of P2$_1$/c, and Sample A has similar peaks, it was seen that K$_2$In$_2$P$_3$ of Sample A had a space group of P2$_1$/c.

Figure 3:
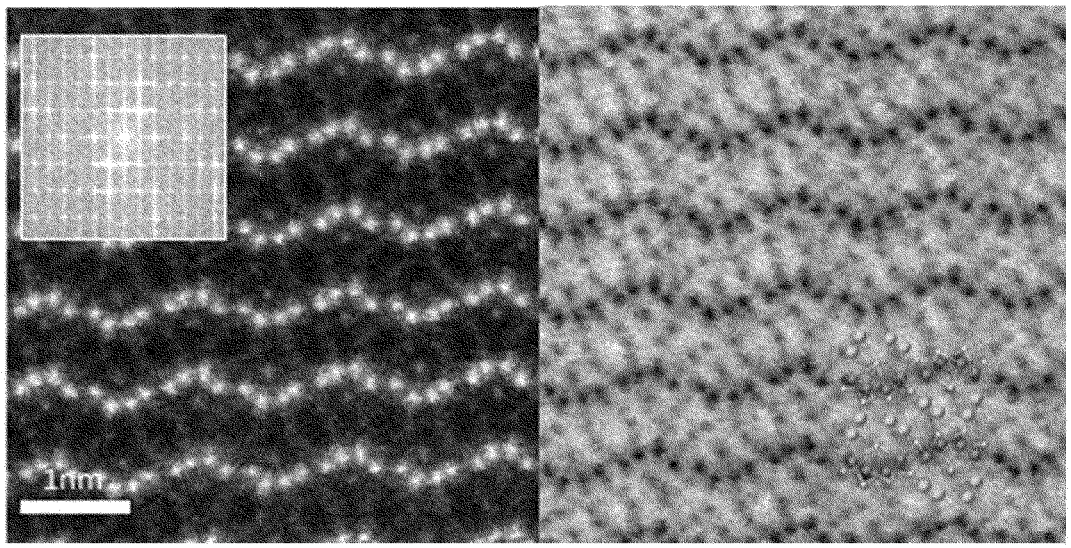
FIG. 3 is a scanning transmission electron microscopy (STEM) image of samples according to an embodiment of the invention.
Figure 3:
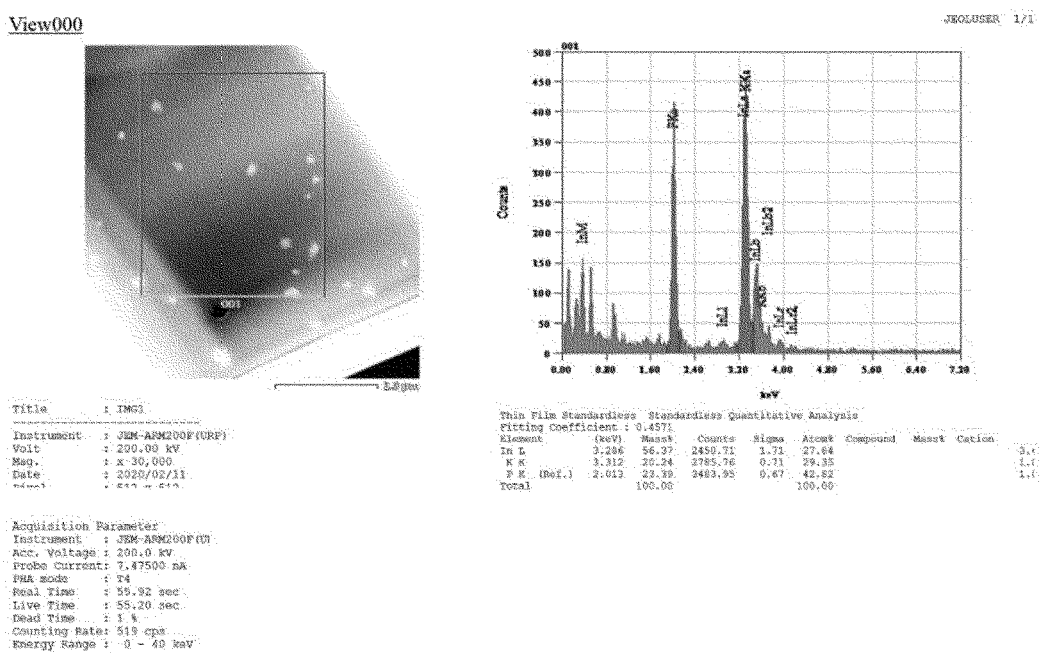

FIG. 3 is a scanning transmission electron microscopy (STEM) image in a zone-axis [010] direction for Sample A and results of energy dispersive spectroscopy (EDS) analysis.

The STEM image showed an atomic structure image consistent with the structure of the P2$_1$/c material projected by XRD, and the results of the EDS elemental composition analysis of the same sample showed 29.35:27.84:42.82 which is close to 2:2:3. Accordingly, it was found that the synthesized K, In, P compound was a 2:2:3 compound having a P2$_1$/c structure, indicating that a new material was synthesized.

Figure 4:
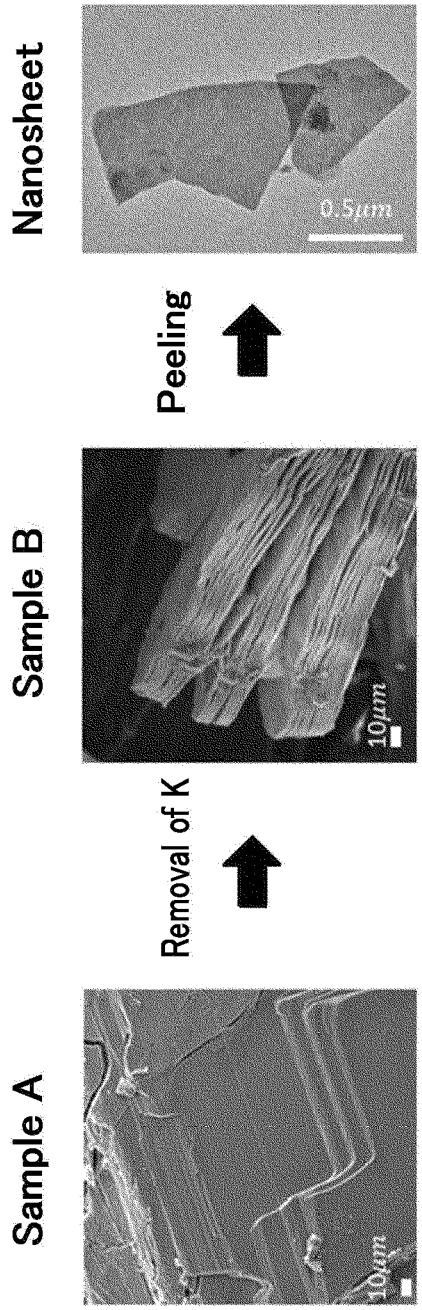
FIG. 4 is a scanning electron microscopy (SEM) image of a layered compound and a transmission electron microscopy (TEM) image of a nanosheet according to an embodiment of the invention.

FIG. 4 shows Sample A before K was removed, Sample B after K was partially removed, and a nanosheet peeled off from Sample B.

Sample A before the removal of K showed a layered structure and closely adhered between the layers, but in Sample B, after the partial removal of K, the interlayer distance of the layered structure increased, forming cracks. Accordingly, easier peeling is enabled to prepare nanosheets.

Figure 5:
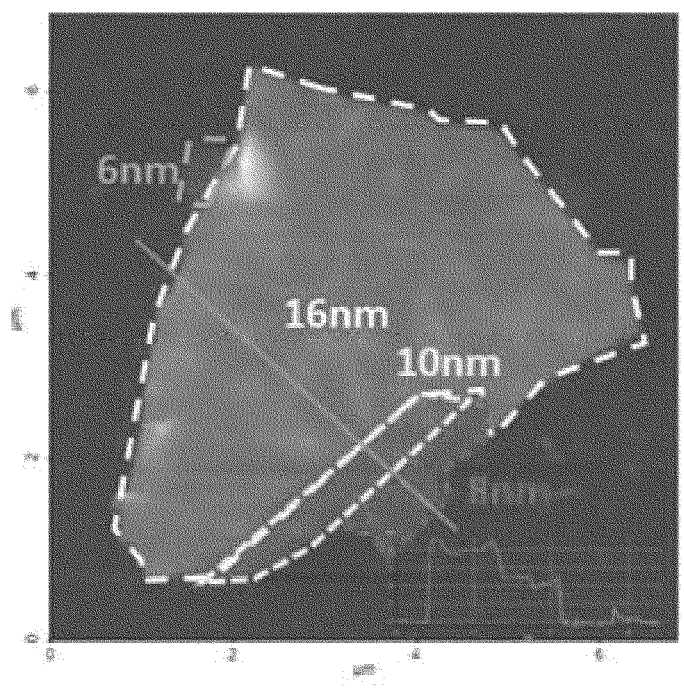
FIG. 5 shows an atomic force microscopy (AFM) image of a nanosheet according to an embodiment of the invention and a line-profile therefrom.

FIG. 5 shows an atomic force microscopy (AFM) image of a nanosheet peeled off from Sample B and a line-profile therefrom. It was found that a nanosheet having a thickness of 6 nm to 16 nm and a width of several μm was prepared.

Figure 6:
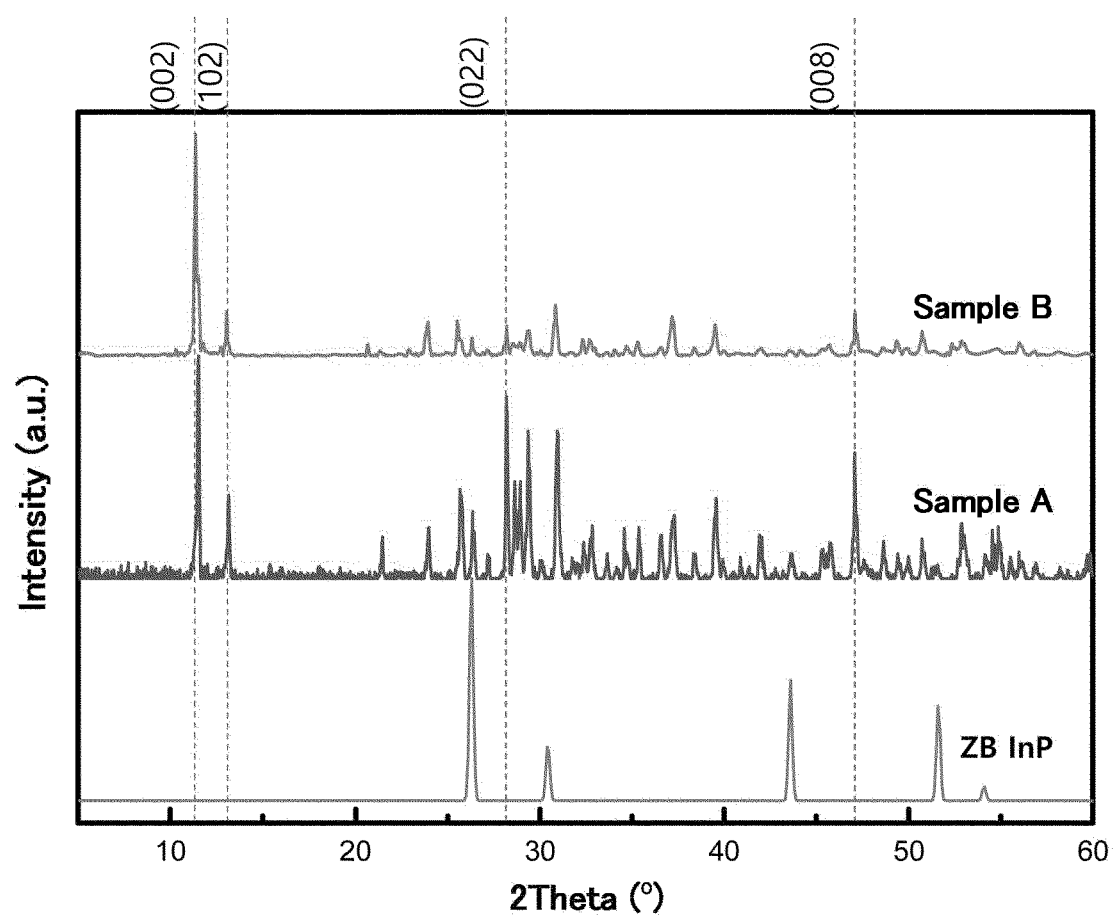
FIG. 6 is a graph illustrating results of XRD analysis of samples according to an embodiment of the invention.

FIG. 6 shows XRD peaks of InP having a general zinc blende structure, XRD peaks of Sample A, and XRD peaks of Sample B from which K is partially removed.

It was found that Sample A and Sample B had a different structure from InP having a general zinc blende structure, and with the removal of K from K$_2$In$_2$P$_3$, and the peak intensity of the (002) plane became greater than that of the other plane.

Figure 7:
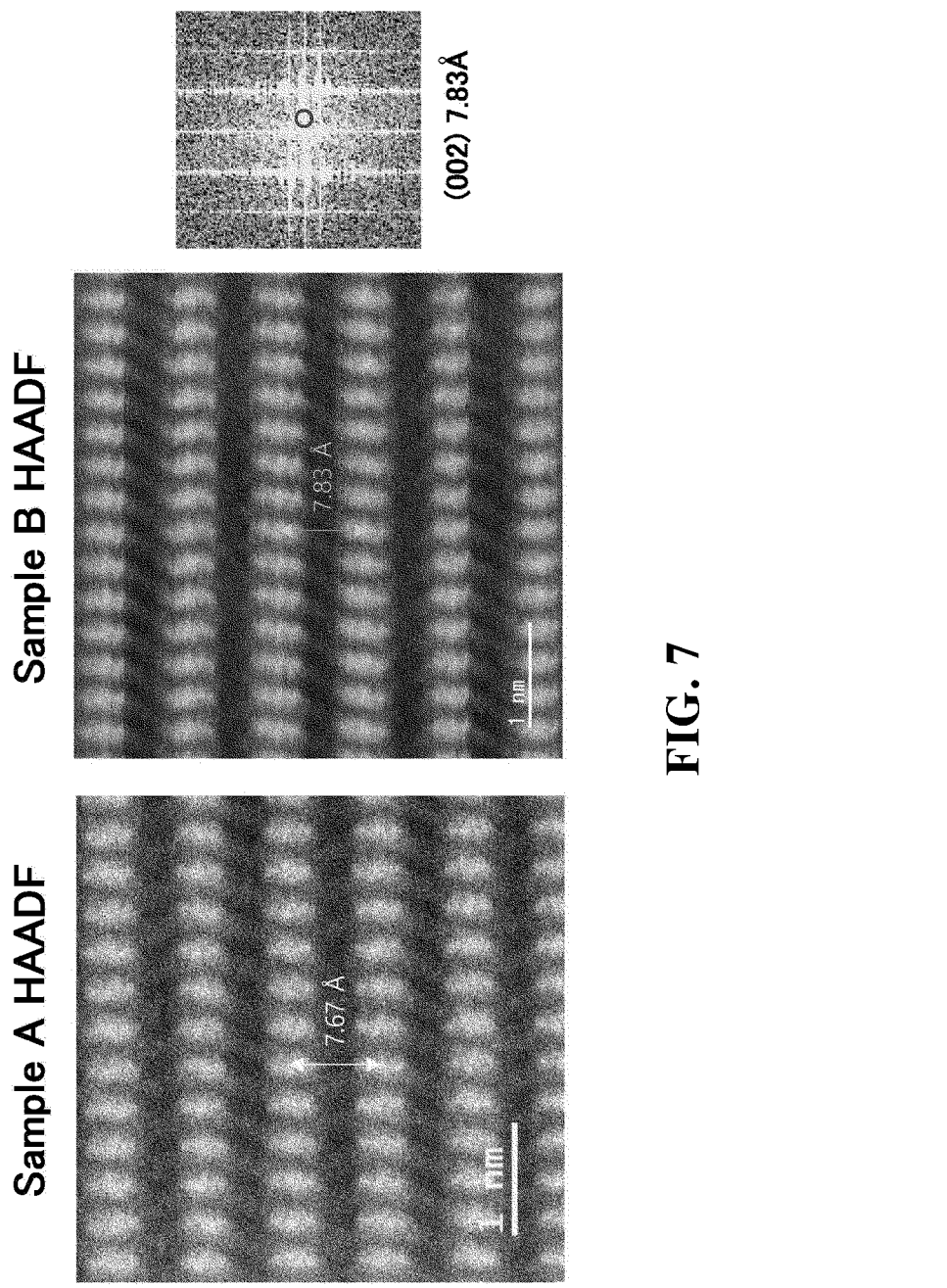
FIG. 7 shows a STEM image of samples according to an embodiment of the invention and results of fast Fourier transform (FFT) of the image.

FIG. 7 shows a STEM image of Sample B and a fast Fourier transform (FFT) results of the image. It was found from the results of the STEM image and FFT that despite the fact that some of the additive elements was removed, the crystal structure was kept without a change to another structure or amorphization, and a slight increase (7.67 Å→7.83 Å) in a c-axis direction [001] was caused.

Figure 8:
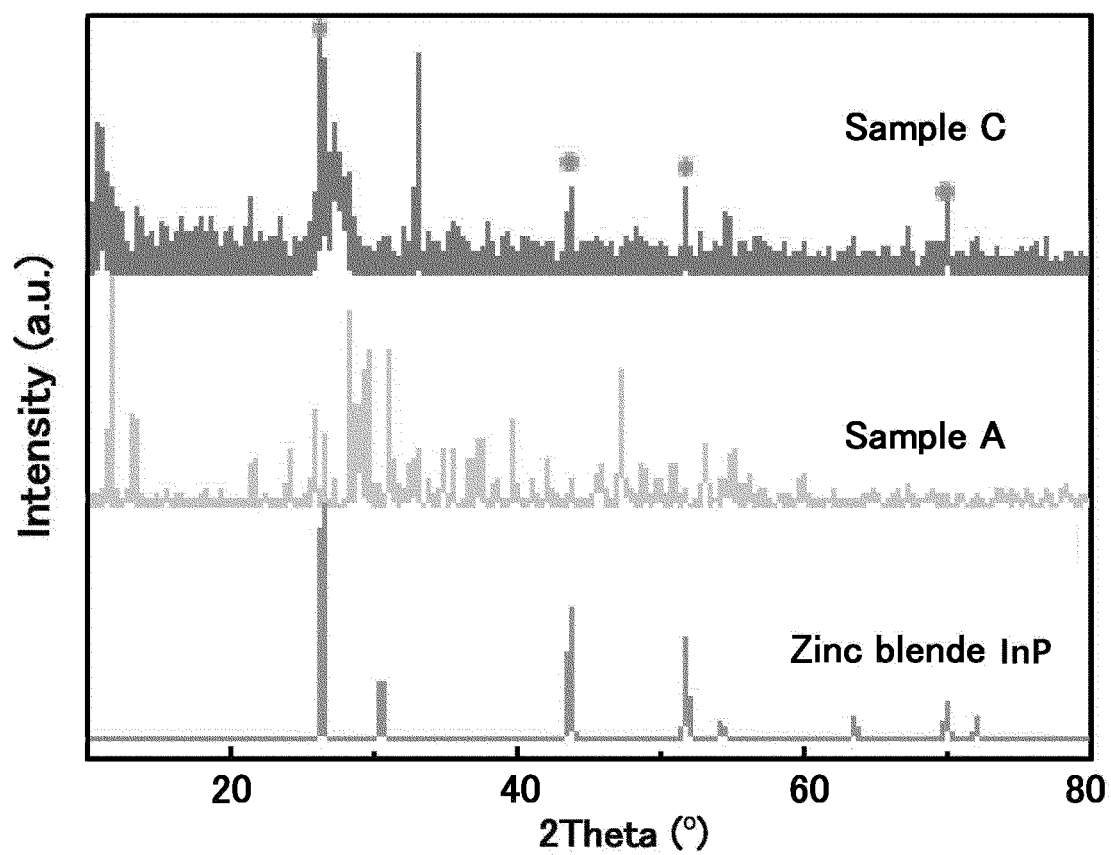
FIG. 8 is a graph illustrating results of XRD analysis of samples according to an embodiment of the invention.

FIG. 8 shows XRD peaks of InP having a general zinc blende structure, XRD peaks of Sample A, and XRD peaks of Sample C from which K was mostly removed.

Figure 9:
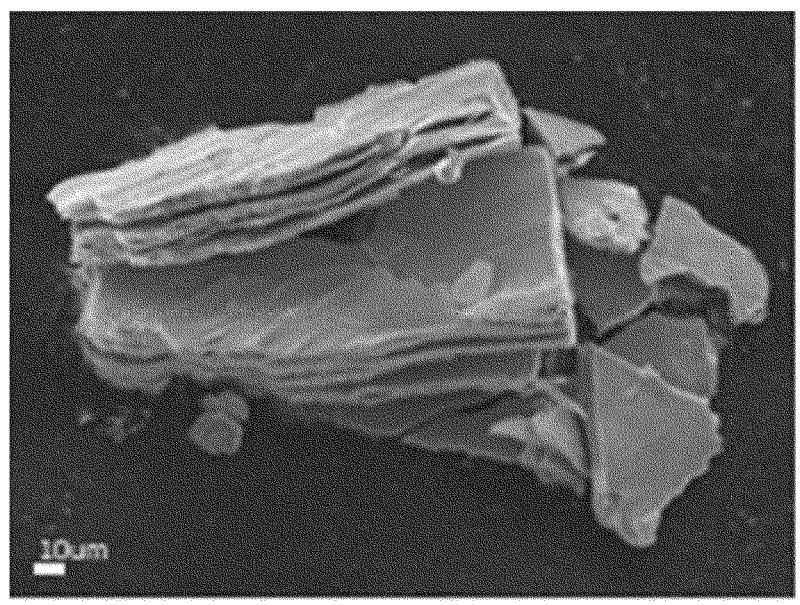
FIG. 9 is an SEM image of a layered compound according to an embodiment of the invention.

Sample C shows that the peaks of Sample A before the removal of K gradually switched to the peaks of InP having a zinc blend structure. However, as shown in the SEM image for Sample C of FIG. 9, Sample C had a zinc blende crystal structure, but still had a two-dimensional layer, and thus a nanosheet was easily prepared by being peeled off from Sample C.

Figure 10:
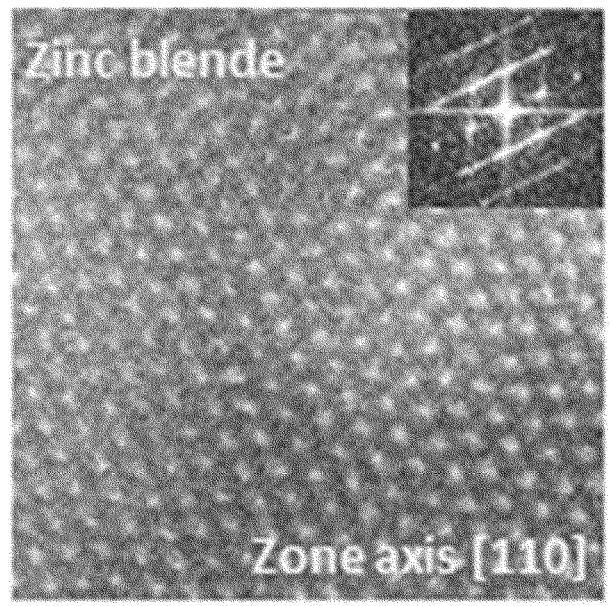
FIG. 10 is a TEM image of a nanosheet according to an embodiment of the invention.

The TEM image for a zone-axis [110] for the nanosheet prepared therefrom is shown in FIG. 10, and it was found that the nanosheet had a zinc blende crystal structure.

Figure 11:
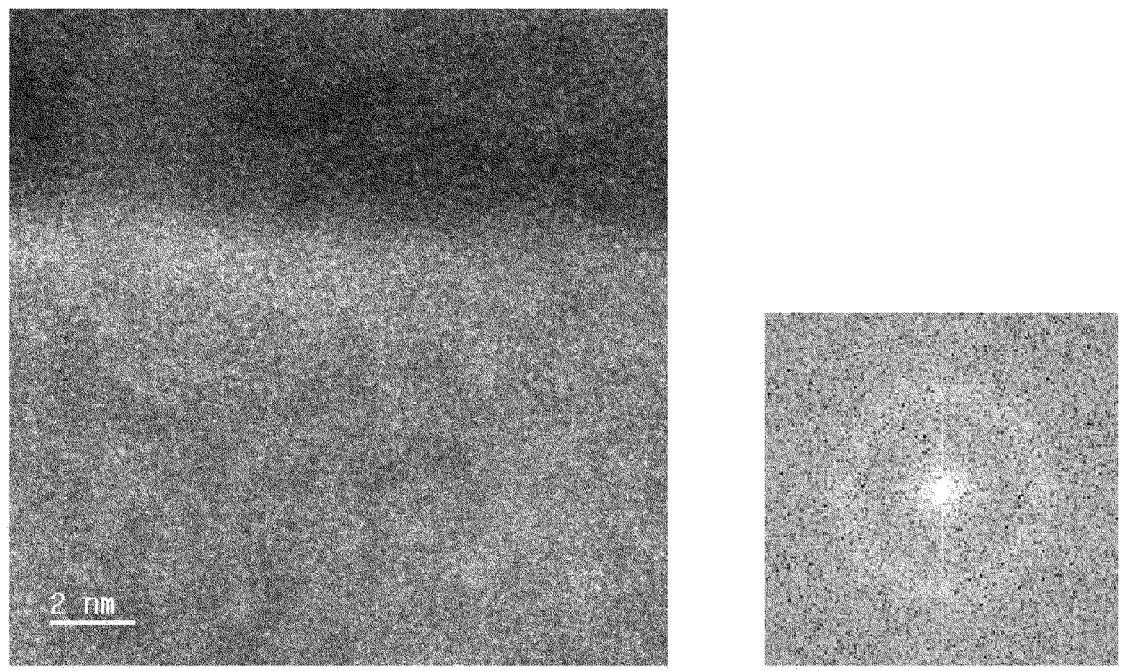
FIG. 11 is a TEM image of a nanosheet according to an embodiment of the invention.

Meanwhile, as in Sample D, the layered compound from which K element was mostly removed may have an amorphous structure, and that allows the peeled nanosheet to keep an amorphous structure as well (see FIG. 11).

Figure 12:
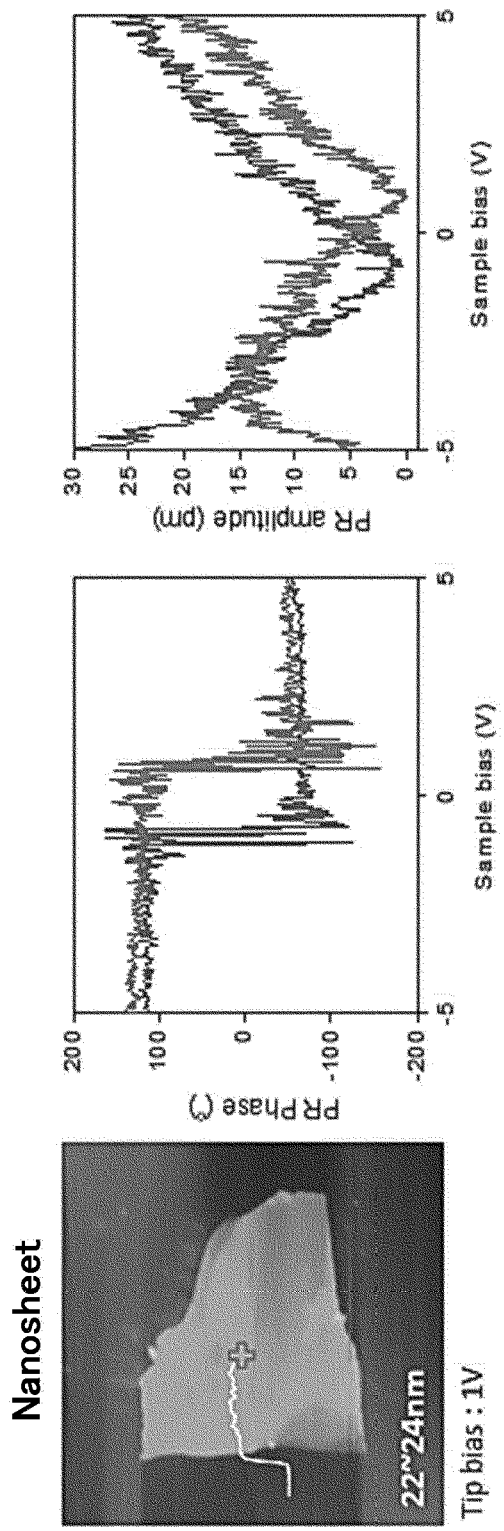
FIG. 12 is results of measuring hysteresis loop of samples according to an embodiment of the invention.

In FIG. 12, ferroelectric-like properties were measured through an AFM image for the nanosheet peeled off from Sample B and piezoresponse force microscopy (PFM) in the nanosheet, and a hysteresis loop therefrom was showed. The nanosheet had ferroelectric properties applicable to actual electrical devices.

Figure 13:
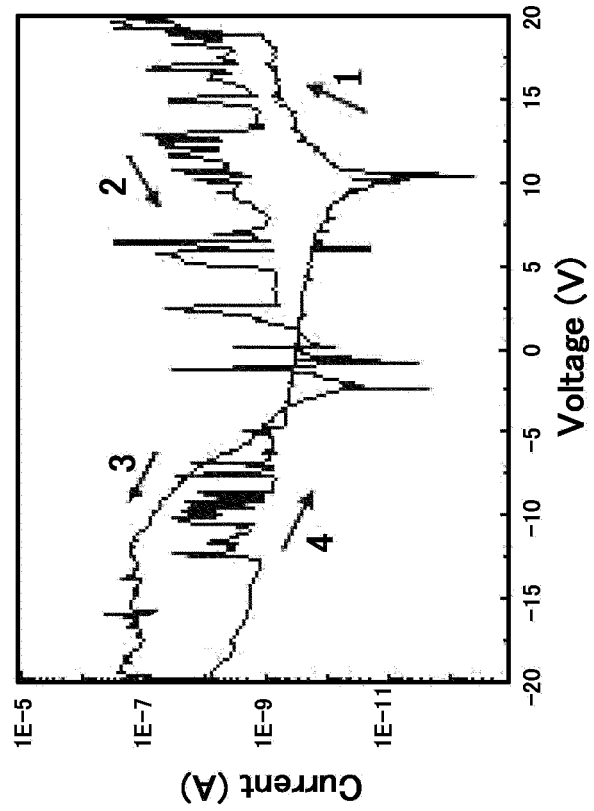
FIG. 13 is voltage-current curves of samples according to an embodiment of the invention.
Figure 13:
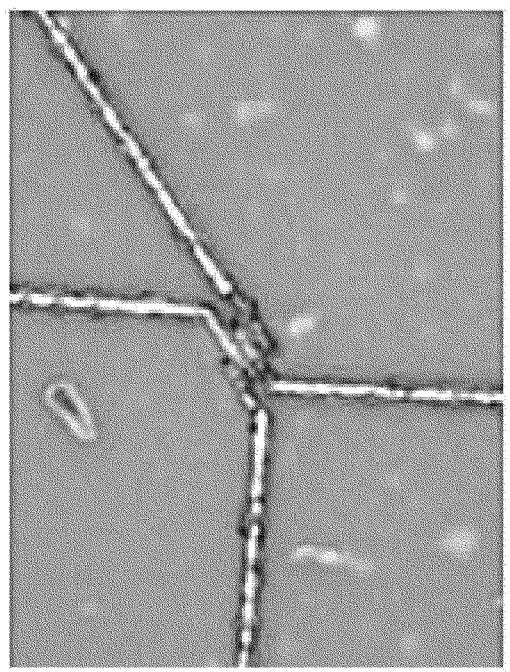

In addition, current changes according to voltages were measured for the nanosheet peeled off from Sample B, and results are shown in FIG. 13.

It was found that at an initial voltage, the nanosheet kept a high resistance state 1, indicating a low current flow, but when the voltage was greater than a certain level, the nanosheet switched to a low resistance state 2, indicating a sharp increase in the current, thereby exhibiting resistance switching properties.

It was found that using the resistance switching properties, the nanosheet would be applied as a memristor device, which is being actively developed as a neuromorphic memory device.

What is claimed is:

1. A layered compound represented by Formula 1 below:

$$K_{1-x}In_yP_z \quad \text{[Formula 1]}$$

(0≤x<0.9, 0.75≤y≤1.25, 1.25≤z≤1.75).

2. The layered compound according to claim 1, wherein, the x is 0.

3. The layered compound according to claim 1, wherein the x satisfies 0.1≤x<0.9.

4. The layered compound according to claim 1, wherein the x satisfies 0.25≤x≤0.75.

5. The layered compound according to claim 1, wherein the layered compound further comprises H.

6. The layered compound according to claim 1, wherein, in XRD measurement using CuKα rays, the layered compound has peaks at the positions of θ=11.51±0.50°, 13.11±0.50°, 25.54±0.50°, 28.09±0.50°, 29.49±0.50°, and 30.81±0.50°, the peaks having an intensity of 3% or greater with respect to a peak having the greatest intensity.

7. The layered compound according to claim 1, wherein a crystal structure of the layered compound exhibits a space group of P2$_1$/c.

8. The layered compound according to claim 1, wherein the layered compound exhibits ferroelectric-like properties.

9. The layered compound according to claim 1, wherein the layered compound exhibits resistance switching properties.

10. A nanosheet comprising a compound represented by Formula 1 below, and prepared through a physical or chemical peeling method:

$$K_{1-x}In_yP_z \quad \text{[Formula 1]}$$

(0≤x<0.9, 0.75≤y≤1.25, 1.25≤z≤1.75).

11. The nanosheet according to claim 10, wherein a crystal structure of the compound exhibits a space group of P2$_1$/c.

12. The nanosheet according to claim 10, wherein the compound has a zinc blende crystal structure or an amorphous phase.

13. The nanosheet according to claim 10, wherein the compound exhibits ferroelectric-like properties.

14. The nanosheet according to claim 10, wherein the compound exhibits resistance switching properties.

15. The nanosheet according to claim 10, wherein the nanosheet has a thickness of 500 nm or less.

16. An electrical device comprising the layered compound according to claim 1.

* * * * *